US008832337B2

(12) United States Patent
Cerato et al.

(10) Patent No.: US 8,832,337 B2
(45) Date of Patent: Sep. 9, 2014

(54) INTERFACING CIRCUIT COMPRISING FIFO STORAGE IN ORDER TO DETERMINE WHEN TO PREVENT MULTIPLE CONSECUTIVE NON-IDENTICAL DATA BASED ON DIFFERENCE THRESHOLD

(75) Inventors: Eric Cerato, Magagnosc (FR); Lionel Sinegre, Nice (FR)

(73) Assignee: ST-Ericsson SA, Plan-les-Ouates (CH)

( * ) Notice: Subject to any disclaimer, the term of this patent is extended or adjusted under 35 U.S.C. 154(b) by 102 days.

(21) Appl. No.: 13/384,797

(22) PCT Filed: Jul. 20, 2010

(86) PCT No.: PCT/EP2010/004426
§ 371 (c)(1),
(2), (4) Date: Feb. 25, 2012

(87) PCT Pub. No.: WO2011/009591
PCT Pub. Date: Jan. 27, 2011

(65) Prior Publication Data
US 2012/0144074 A1    Jun. 7, 2012

(30) Foreign Application Priority Data
Jul. 21, 2009   (FR) .................................... 09 03592

(51) Int. Cl.
G06F 5/14       (2006.01)
G06F 5/06       (2006.01)
(52) U.S. Cl.
USPC ............................. 710/55; 710/56; 345/556

(58) Field of Classification Search
USPC ........................ 710/55, 56; 345/556
See application file for complete search history.

(56) References Cited

U.S. PATENT DOCUMENTS 4,201,105 A * 5/1980 Alles ............................... 84/606
5,670,993 A * 9/1997 Greene et al. ................. 345/556
6,772,280 B1   8/2004 Kamijo
7,457,894 B2 * 11/2008 Roever ........................... 710/56

FOREIGN PATENT DOCUMENTS

JP          02202629 A      8/1990

* cited by examiner

*Primary Examiner* — Tammara Peyton
(74) *Attorney, Agent, or Firm* — Coats & Bennett, P.L.L.C.

(57) ABSTRACT

An interfacing circuit comprising a First In First Out (FIFO) memory for exchanging data between a "data producer device" and a "data consumer device". The FIFO memory is controlled by first write control signals (WR, CLK_WR) and second read control signals (ENABLE, Clk_Rd). The interfacing circuit further includes: a redundancy filter (230) for receiving a sequence of N data ($Y_0, Y_1, Y_2 \ldots Y_{n-1}$) to be stored within said FIFO, and for generating a redundancy control word representative of the presence of consecutive identical data within said sequence; means (250) for controlling said first and said second control signals of said FIFO for the purpose of preventing the storage into said FIFO of multiple consecutive identical data and more important to make possible to accelerate the average speed of the data flux going to the "data consumer device" without need to accelerate the clocking of the memory feeding the said FIFO thanks to increase of efficiency of transfers due to redundancy filtering.

12 Claims, 5 Drawing Sheets

WRITE state machine

READ state machine

INTERFACING CIRCUIT COMPRISING FIFO STORAGE IN ORDER TO DETERMINE WHEN TO PREVENT MULTIPLE CONSECUTIVE NON-IDENTICAL DATA BASED ON DIFFERENCE THRESHOLD

TECHNICAL FIELD

The invention relates to the field of electronic circuits and more particularly to an interfacing circuit comprising a First In First Out (FIFO) storage.

BACKGROUND ART

FIFO storages are well known in the art of electronic circuits and computers and are widely used for embodying interfacing circuits in many different applications.

They are particularly widely used, but not exclusively, in the field of image and video processing.

FIG. 1 reminds the general architecture of an interfacing circuit based on a FIFO memory which allows the transfer of data (such as audio samples or picture elements) FROM a "data producer device" 100 (such as audio or image sensor) via a lead 99 or we can consider that data are already available in a memory 150, TO, a "data consumer device" 299 (like a signal processor device for audio, video or image). The circuit comprises an interface 120 receiving data from memory 150 via a data bus 151. The interface 120 is used for proper formatting operation of the data before it is forwarded to a FIFO 100 through a data bus 101. The reading of the FIFO is controlled by the "data consumer device" 299 represented by an external circuit (image or audio signal processor) by means of a ENABLE lead 113 and a CLK_RD clock signal lead 112. On the other side, the writing of the FIFO by the "data producer" 100 is controlled by a (inverted) WR signal 103 under the clocking of a WR signal conveyed by a lead 102. Two additional FIFO_FULL and FIFO_empty signals, respectively on leads 121 and 122, are used for respectively reporting a situation of full storage and empty storage to the "data producer" 100 and "data consumer devices" 299.

The circuit which is represented in FIG. 1 is a typical example of a set of well known circuits and, therefore, does not need to elaborate any further introduction nor development to a skilled man.

Briefly, it suffices to recall that such circuit is widely used for achieving many different interfaces, such as image and video interface such as camera interface circuits.

However, one may recall the general trend to an increase of the resolution of image sensors which lead to a significant volume of data to be transferred between the sensors/memory to the video or image interface circuits.

This drastic increase in the volume of data clearly generates a significant pressure on the FIFO circuits which have to operate at very high speed clocks.

The continuous trend to higher speeds might result the designer to proceed with a new redesign of the analog interface and therefore the interfacing circuits comprising the FIFO. Such redesign would inevitably results in higher manufacturing costs which is not desirable.

Alternatively, one may wish to improve the design of the conventional FIFO based interfacing card so as to increase the efficiency even without increasing the frequency of the clocking circuits.

Such is the technical problem to be solved by the present invention.

SUMMARY OF THE INVENTION

It is an object of the present invention to provide a new architecture for an interfacing circuit, based on a FIFO storage, which provides increased data rate in the transfer of data.

It is another object of the present invention to provide an enhanced architecture for a interfacing circuit which limits the size of the FIFO storage required for interfacing two circuits.

It is still a further object of the present invention to provide a new interface circuit for an image and video system of a 2G/3G mobile terminal baseband circuit.

These and other objects are achieved by means of a interfacing circuit comprising a First In First Out (FIFO) memory for exchanging data between a first system (known as <<data producer>>) and a second system (known as <<data consumer>>). The FIFO memory is controlled by first write control signals (WR, CLK_WR) and second read control signals (ENABLE, Clk_Rd).

The interfacing circuit further includes:
- a redundancy filter for receiving a sequence of N data (such as audio or image luminance samples $Y_0, Y_1, Y_2 \ldots Y_{n-1}$) to be stored within said FIFO, and for generating a redundancy control word representative of the presence of consecutive identical data within said sequence;
- means for controlling said first and said second control signals of said FIFO for the purpose of preventing the storage into said FIFO of multiple consecutive identical data (redundant samples).

Therefore, the redundant data are simply not written in the FIFO during the WRITE operation and, conversely, during the READ operation, the ENABLE control lead is not activated what results in the fact that the same output data (assumed to be a redundant data) is represented again at the output interface of the FIFO.

This results in the fact that the conventional FIFO may be used with a READ clock interface which is much higher depending on the redundancy of the information which is stored within the memory or sensed by the sensor.

In the case of audio samples or picture elements (pel), the redundancy may be particularly significant, thus resulting in a significant increase of the performance of the FIFO.

In one embodiment, redundancy filter generates said redundancy control word in addition to a filtered sequence of data $Y_0, Y^*_1, Y^*_2 \ldots Y^*_{n-1}$ to be stored into the FIFO.

In one embodiment, the control unit comprises two WRITE and READ state machines for the purpose of generating the control signals of the FIFO.

The invention also achieves a 2G/3G mobile terminal baseband circuit comprising a First In First Out (FIFO) memory for transferring data between a <<data producer device>> and a <<data consumer device>>. The FIFO memory is controlled in first case by write control signals (WR, CLK_WR) and by read control signals (ENABLE, Clk_Rd) in the second case.

The interfacing circuit further includes:
- a redundancy filter for receiving a sequence of N data ($Y_0, Y_1, Y_2 \ldots Y_{n-1}$) to be stored within said FIFO, and for generating a redundancy control word representative of the presence of consecutive identical data within said sequence (then called redundant data);
- means for controlling said first and said second control signals of said FIFO for the purpose of preventing the storage into said FIFO of multiple consecutive identical data.

DESCRIPTION OF THE DRAWINGS

Other features of one or more embodiments of the invention will best be understood by reference to the following detailed description when read in conjunction with the accompanying drawings.

DESCRIPTION OF THE PREFERRED EMBODIMENT

There will now be described one particular embodiment of the invention which consists in an interfacing circuit for providing high speed data rate for an image processor contained in the imaging and video sub-system of a 2G/3G terminal baseband circuit.

Indeed such embedded image processor requires (to fulfill state of the art video support), both big image resolutions and large frame rates resulting in a very high speed data flux from the image sensor to the image signal processor.

Such application requires for example in the case of a parallel interface, reception of data clock, video synchronization signals (vertical+horizontal) and data on a parallel bus that will be called here "Camera Interface Bus". In a real product, an external device called an image sensor is connected to this bus, delivering a pixel clock, vertical and horizontal video synchronization depending on data format and pixel data (on 8 or 10 bits) as processed by the image sensor optics and sensor embedded signal processor.

Clearly, in view of the high resolution and high frame rate of the image and video captures, the interface between the sensor (or the memory storing the images and video files) requires a very high rate of transfer and such high rate significantly stresses the intermediate storage circuit, such as the FIFO.

Figure 3:
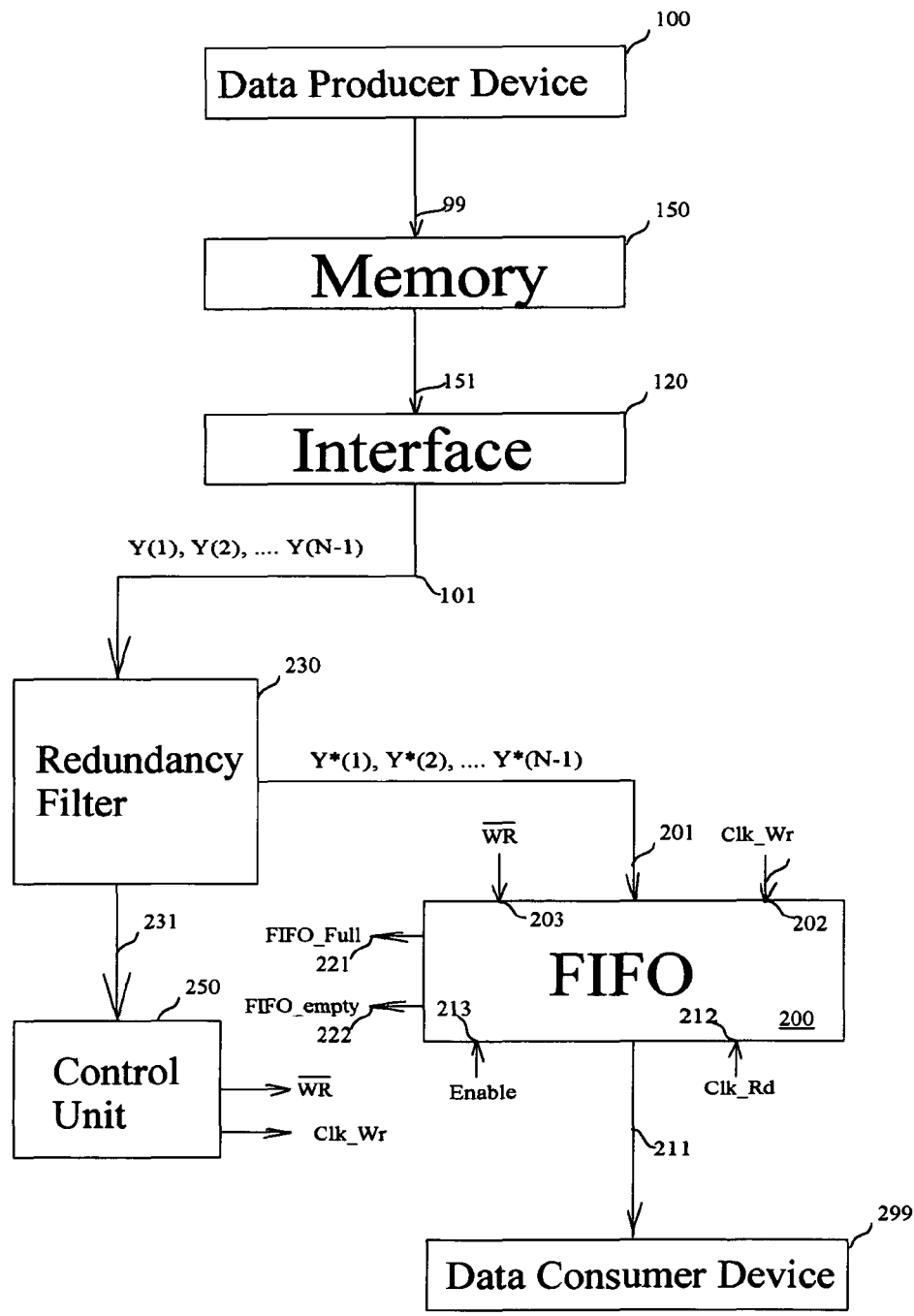
FIG. 3 illustrates on embodiment of an interfacing circuit comprising a redundancy filter.

FIG. 3 illustrates one embodiment of an interfacing circuit which achieves high speed transfer of the data generated by a data producer device 100 providing data into a memory 150) or, alternatively by a memory 150 and an external (data consumer device 299) video processing interface receiving a high speed flux of pixel data via a bus 211. By using memory 150 in lieu of a real sensor, the interfacing circuit becomes able to continuously produce loop images.

It should be noticed that, generally speaking, the particular realization of the interfacing circuit of FIG. 3 depends on the data format used for representing the image and video: (YUV 422-BT601, YUV 422-BT656, Raw Bayer-BT601, Raw Bayer-BT656, Data mode). In particular, the processing of pixel data being represented in colors components will result in the use of three FIFO circuits, one dedicated to each particular color component (R, G, B or Y, U, V).

For clarity's sake, the interfacing circuit of FIG. 3 only shows one FIFO storage but it is clear to the skilled man that the circuit of FIG. 3 may be adapted and arranged so as to include multiple FIFO circuits, each dedicated to one color component.

Furthermore, the conventional address and control bus are being arranged so as to allow the interface between memory 150 and circuit 120. All those buses being simply illustrated by bus 151.

Interface 120 achieves a physical interfacing between the particular format of the data stored into memory 150 (e.g. a 32 bit format) and the format of the subsequent FIFO storage. For instance, in the preferred embodiment, interface 120, will performs successive reading operation into memory 150 so as to generate on a bus 101 a 192 bits vector (for instance) which is representative of a sequence of picture elements or more generally data to be processed.

In one particular embodiment, the interface 120 produces a series of picture elements (pel) belonging to a group of N pels. $Y_0, Y_1, Y_2 \ldots Y_{n-1}$ The interfacing circuit further comprises a redundancy filter 230 which receives the pixel data $Y_0, Y_1, Y_2 \ldots Y_{n-1}$ which is carried by bus 101 and which forward to FIFO 201 via a lead 201 a corresponding sequence of filtered values $Y_0, Y^*_1, Y^*_2 \ldots Y^*_{n-1}$. Furthermore, redundancy filter 230 generates a control word on a bus 231 consisting in a vector of n+1 bits, where each <<0>> represents a redundancy present in the corresponding pels.

Practically, if one particular pel Yk is identical to pel Yk−1, the control word will be such that:

CW [k]=0, otherwise it is equal to 1.

Figure 1:
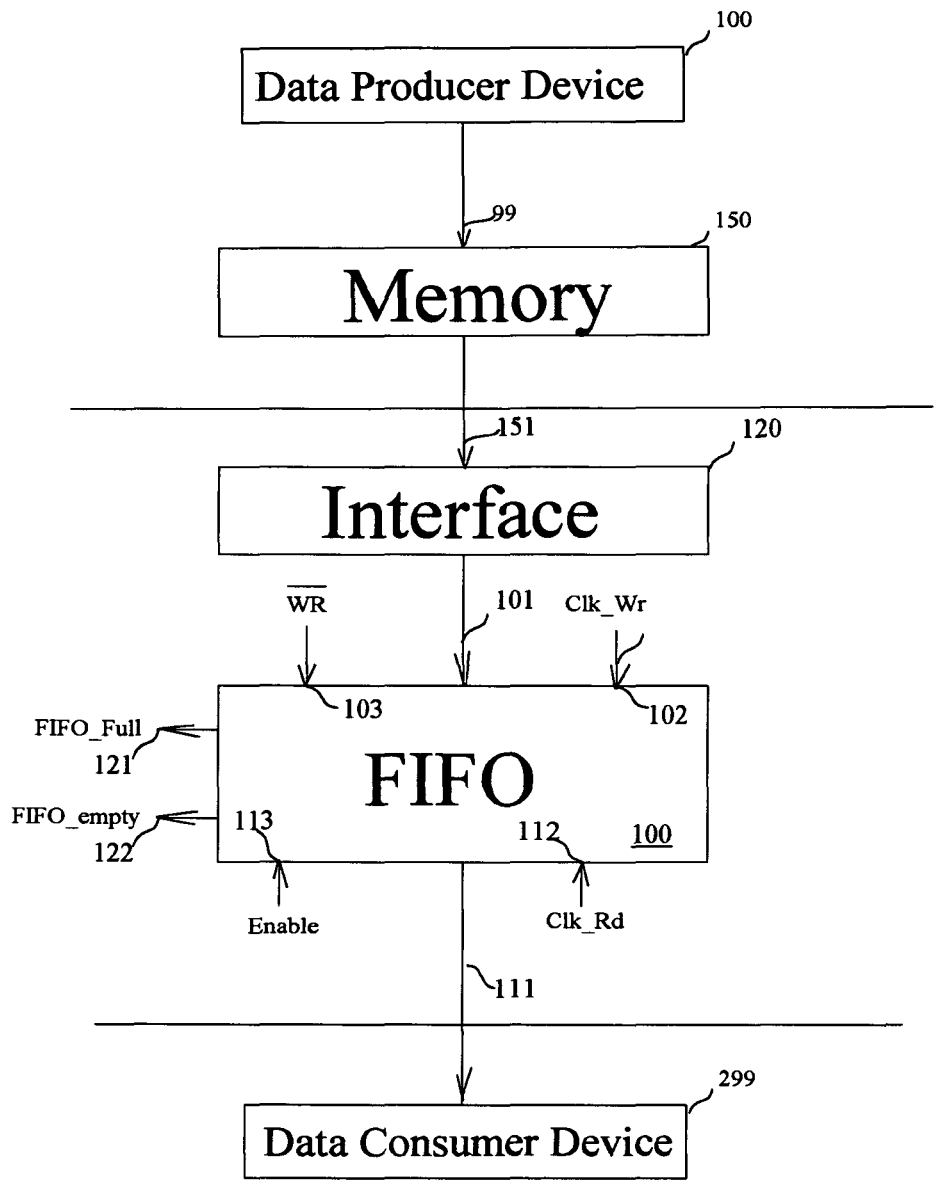
FIG. 1 illustrates a known architecture of an interfacing circuit based on a conventional FIFO circuit.
Figure 2:
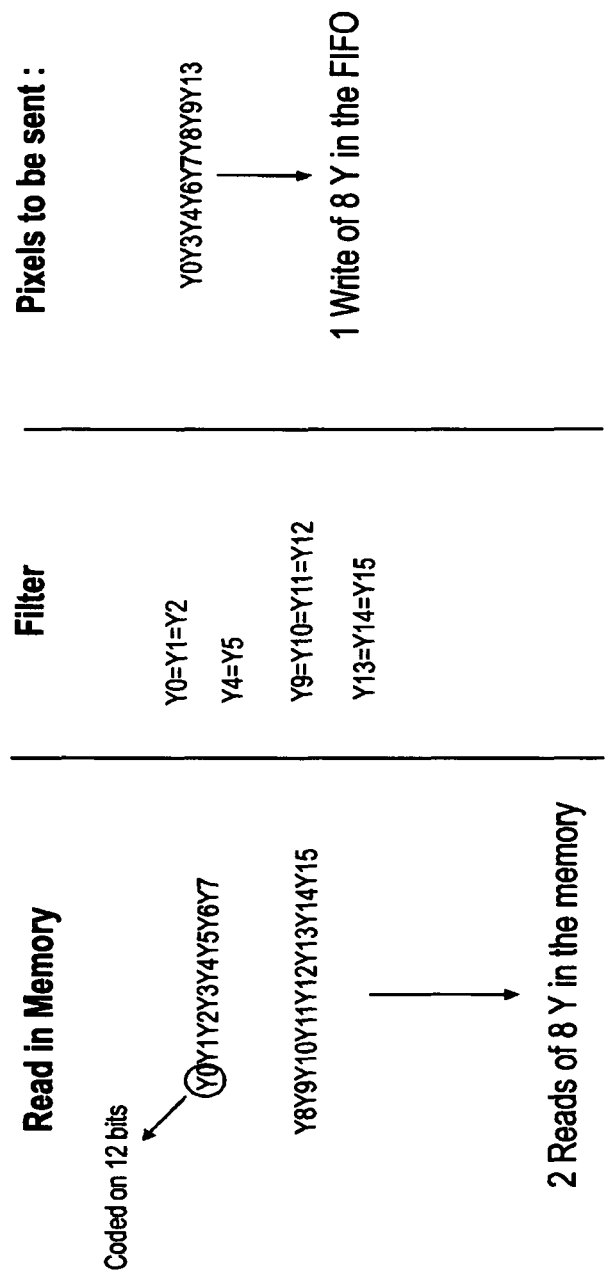
FIG. 2 illustrates the principle of the redundancy filter used in the interface circuit shown in FIG. 3.

FIG. 2 particularly illustrates one example of 16 consecutive pels Y0, Y1, Y2, ... Y15, which are such that:

Y0=Y1=Y2;
Y4=Y5;
Y9=Y10=Y11=Y12;
Y13=Y14=Y15

In that case, redundancy filter 230 generates the following control word:

CW=(1, 0, 0, 1, 1, 0, 1, 1, 1, 1, 0, 0, 0, 1, 0, 0)

Representative of the redundancy of the pels in the group of N.

It can be seen that a <<1>> in the control word is representative of a pel Y[i] (i=1 to N−1) which is considered to be significant (since it provides a new information), while a <<0>> is representative of a non significant (or redundant) pel because it carries a value which was already carried by the previous one.

While the example which was described above is based on a <<strict>> mathematical comparison of the two consecutive pels—0 being reported only when strict mathematical equality—many embodiments may be considered for the purpose of generating a redundancy filtering based on the measurement of <<distance>>between two consecutive pels.

Alternatively, one may consider a more complex redundancy filtering reporting, for instance, a close proximity of two subsequency pels. For instance, one may decide that the redundancy vector will report a <<0>> when the difference between two consecutive pels is inferior to a predetermined threshold.

It can be seen in the FIG. 3 that the control word CW which is generated by redundancy filter 230 is forwarded to a control unit 250 which achieves the generation of write control signals, and particular the WR (inverted) and CLK_WRITE signals, respectively on leads 203 and 202) controlling the FIFO memory 200 which, on the other side, receives from the data consumer (such as audio or image processor) the conventional ENABLE signal on a lead 213 and the CLK_RD clock signal on a lead 212.

Control Unit 250 generates the WR (inverted) and CL WR control signals so as to reduce the writing operations within FIFO 200 when the considered pels Y[i] carries a non significant data (CW[i]=0). Conversely, when the pels Y[i] carries a is significant data (CW[i]=1), then an effective WRITE operation is performed within the FIFO so as to keep in the storage such data.

By only writing the significant pels (corresponding (CW[i] =1)), one can avoid a write operation in FIFO 200 and thus reduce both the amount of data written 20 in FIFO and the average speed on the write clock.

But what is even more interesting is that the interfacing circuit of FIG. 3 allows a significant increase of the average READ clock of the <<data consumer device>> (without any need of an increase in the speed of access in memory 150, 25 which can hence be a low cost slow memory). This gain is obtained at redundancy occurrence instants by just repeating redundant data on lead 211 towards data consumer device. What happens is that during periods of high redundancy pels, while the same redundant data is repeated at lead 211 to consumer device, the FIFO has time to refill from the slow memory. This significantly reduces the probability for a FIFO_EMPTY signal to occur later on. It is important to notice that in case of a slow memory 150, the rate of activity of FIFO_EMPTY signal is directly correlated to the slow down of the average data flux going to the <<data consumer device>> through lead 211.

In other words, it can be seen that the new architecture of the interfacing circuit which is shown in FIG. 3, allows an increase of the <<clk_read>> while requiring any change in the fundamental structure of the FIFO. By using the arrangement shown in FIG. 3, a conventional FIFO may be operated at a higher read clock.

Alternatively, a given FIFO storage, having predetermining clocking requirements, can be used at an extended high rate.

With respect to FIGS. 4 and 5, there will now be described the two state machines embodying the control unit 250.

Figure 4:
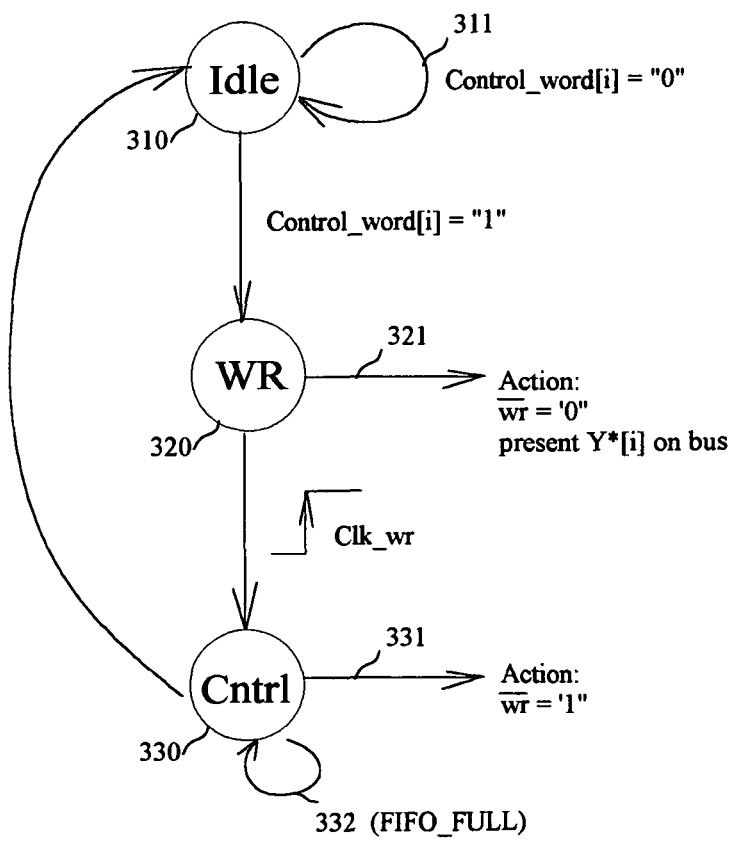
FIG. 4 illustrates the principle of the write state machine.

FIG. 4 shows the state machine of the WRITE operation of FIFO 200.

State 310 consists in an IDLE state which the state machine remains as long as the value of the current index <<i>> of the control word CW(i) (with i=1 to N−1) is equal to <<0>>. (arrow 311), that is to say as long as the pixel data is representative of a non significant (or redundant) data.

When the value of the current index CW(i) is equal to a <<1>>, which is representative of a significant pixel data (giving a new information also named <<innovation>> in signal processing theory), then the state machine proceeds to a state 320 (Write) where the following actions (arrow 321) are taken:
  activating the WR control signal of the FIFO by switching the (inverted) WR control signal to a <<0>>; and
  present the redundancy filter value Y*(i) on bus 201

The state machine then waits until a rising edge of the Clk_write signal, in which case it proceeds to a control state 330, where the WR control signal is disactivated by switching the (inverted) WR signal to <<0>>, thus controlling the end of the write operation.

The state machine remains at that state 330 when the FIFO_FULL condition is present, representative of a full condition of the FIFO.

Conversely, if the FIFO does not show to be full, then the state machine proceeds again to the IDLE state 310.

Figure 5:
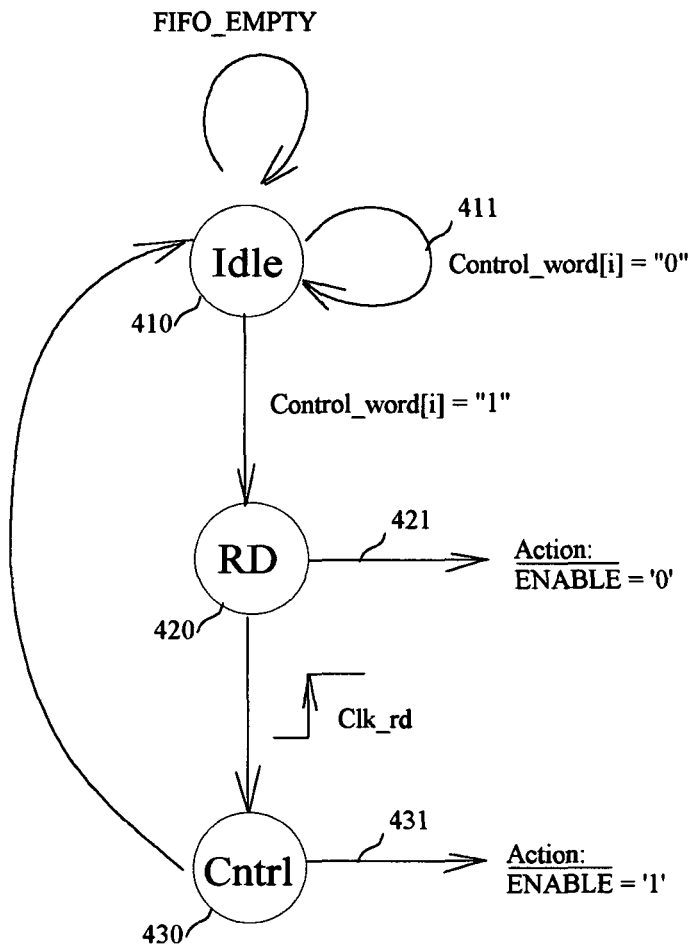
FIG. 5 illustrates the principle of the read state machine

FIG. 5 shows the state machine of the READ operation of FIFO 200.

State 410 consists in an IDLE state which the state machine remains as long as the value of the current index <<i>> of the control word CW(i) (with i=1 to N−1) is equal to <<0>> (arrow 411), but also when the FIFO_empty condition is present. This causes the non significant data to remain at the physical output interface of FIFO 200 which can thus generate the same data to the video system during multiplex periods of the clock rd signals. In that case, FIFO 200 behaves as if it was operated at a high speed receive clock.

When the value of the current index CW(i) is equal to a <<1>>, which is representative of a significant pixel data, then the state machine proceeds to a state 420 (READ) where the ENABLE control lead of the FIFO 200 is activated, by means of switching the (inverted) ENABLE control lead to a <<0>>.

The state machine then waits until a rising edge of the Clk_rd signal, in which case it proceeds to a control state 430, where the ENABLE is disactivated, by means of switching the (inverted) ENABLE control lead to a <<1>>, thus controlling the end of the READ operation.

The state machine then loops back again to IDLE state 410.

It can be seen that, thanks to those two state machines, the significant pixel data are effectively stored and retrieved from FIFO storage 200, while the non significant pixel data remain at the input interface of the FIFO or are simply repeated at the output interface.

The invention claimed is:

1. An interfacing circuit comprising:
  First In First Out (FIFO) memory for exchanging data between a first system and a second system, said FIFO memory being controlled by write and read control signals;
  a redundancy filter configured to receive a sequence of data to be stored within the FIFO memory, and to generate a redundancy control word representative of the presence of consecutive identical data within the sequence and of consecutive non-identical data having a difference that is less than a predetermined difference threshold; and
  a control unit configured to control the write and read control signals of the FIFO memory to prevent the storage of multiple consecutive identical data into the FIFO memory, and to prevent the storage of multiple consecutive non-identical data having a difference that is less than the predetermined difference threshold.

2. The interfacing circuit of claim 1, further comprising an interface unit configured to receive data of the first system from a first memory, and to adapt the format of the received data for storage in the FIFO memory.

3. The interfacing circuit of claim 1, wherein the redundancy filter is configured to generate the redundancy control word in addition to the filtered sequence of data to be stored in the FIFO.

4. The interfacing circuit of claim 1, wherein the control unit, when operating as a WRITE state machine, exhibits the following states:
  a first, IDLE state in which the control unit remains while a value of a current index of the control word indicates non-significant data;
  a second, WRITE state to which the control unit proceeds when the value of the current index of the control word indicates significant data, and within which the control unit is operable to:
    control a WRITE control signal of the FIFO memory to activate write operation of the FIFO memory; and
    present a redundancy filtered data value to the input of the FIFO memory; and
  a third state in which the WRITE control signal of the FIFO memory is deactivated and a check is performed to determine whether the FIFO memory is full;

wherein the control unit operating as the WRITE state machine proceeds from the third state back to the first, IDLE state responsive to the FIFO memory not being full.

5. The interfacing circuit of claim 1, wherein the control unit, when operating as a READ state machine, exhibits the following states:
- a first, IDLE state in which the control unit remains while a value of a current index of the control unit indicates non-significant data;
- a second, READ state to which the control unit proceeds when the value of the current index of the control word indicates significant data, and within which the control unit is operable to activate an ENABLE control signal of the FIFO memory; and
- a third state in which an ENABLE control signal of the FIFO memory is deactivated;
- wherein the control unit operating as the READ state machine proceeds from the third state to the first, IDLE state responsive to the FIFO memory not being empty.

6. The interfacing circuit of claim 1, wherein the FIFO memory stores pixel data to be processed by an image or video system.

7. The interfacing circuit of claim 6, wherein the interfacing circuit is embedded in a mobile terminal baseband circuit.

8. An information processing system comprising:
- an interfacing circuit comprising First In First Out (FIFO) memory configured to receive data from a Data producer system, the FIFO memory being controlled by write and read control signals;
- a redundancy filter configured to receive a sequence of data to be stored within the FIFO memory, and to generate a redundancy control word representative of the presence of consecutive identical data within the sequence and of consecutive non-identical data having a difference that is less than a predetermined difference threshold; and
- a control unit configured to control the first, write control signals and the second, read control signals of the FIFO memory to prevent the storage of multiple consecutive identical data into the FIFO memory, and to prevent the storage of multiple consecutive non-identical data having a difference that is less than the predetermined difference threshold.

9. The information processing system of claim 8, further comprising:
- an interface unit configured to receive data of the Data producer system from a first memory, and to adapt the format of the received data for storage in the FIFO memory.

10. The information processing system of claim 8, wherein the redundancy filter is configured to generate the redundancy control word in addition to the filtered sequence of data to be stored in the FIFO memory.

11. The information processing system of claim 8, wherein the control unit, when operating as a WRITE state machine, exhibits the following states:
- a first, IDLE state in which the control unit remains while a value of a current index of the control word indicates non-significant data;
- a second, WRITE state to which the control unit proceeds when the value of the current index of the control word indicates significant data, and within which the control unit is operable to:
  - control a WRITE control signal of the FIFO memory to activate write operation of the FIFO memory; and
  - present a redundancy filtered value to the input of the FIFO memory; and
- a third state in which the WRITE control signal of the FIFO memory is deactivated and a check is performed to determine whether the FIFO memory is full;
- wherein the control unit operating as a READ state machine proceeds from the third state to the first, IDLE state responsive to the FIFO memory not being full.

12. The information processing system of claim 8, wherein the control unit, when operating as a READ state machine, exhibits the following states:
- a first, IDLE state in which the control unit remains while a value of a current index of the control word indicates non-significant data;
- a second, READ state to which the control unit proceeds when the value of the current index of the control word indicates significant data, and within which the control unit is operable to activate an ENABLE control signal of the FIFO memory; and
- a third state in which an ENABLE control signal of the FIFO memory is deactivated;
- wherein the control unit operating as the READ state machine proceeds from the third state to the first, IDLE state responsive to the FIFO memory not being empty.

* * * * *